United States Patent [19]

Tam et al.

[11] Patent Number: 4,613,400
[45] Date of Patent: Sep. 23, 1986

[54] IN-SITU PHOTORESIST CAPPING PROCESS FOR PLASMA ETCHING

[75] Inventors: Simon W. Tam, San Francisco; Ronald P. Reade, Palo Alto; Jerry Y. K. Wong, Union City; David N. Wang, Cupertino, all of Calif.

[73] Assignee: Applied Materials, Inc., Santa Clara, Calif.

[21] Appl. No.: 736,435

[22] Filed: May 20, 1985

[51] Int. Cl.[4] ............ H01L 21/306; B44C 1/22; C03C 15/00; B05D 3/06
[52] U.S. Cl. ............... 156/643; 156/646; 156/657; 156/659.1; 156/662; 156/904; 204/192.15; 204/192.32; 252/79.1; 427/38; 430/313
[58] Field of Search ............... 427/38, 39; 204/164, 204/192 C, 192 EC, 192 E, 298; 430/313; 156/643, 646, 653, 657, 659.1, 662, 345, 904; 118/728, 50.1, 620; 252/79.1

[56] References Cited

U.S. PATENT DOCUMENTS 4,333,793 6/1982 Lifshitz et al. .......... 156/643
4,521,275 6/1985 Purdes .......... 156/657 X Primary Examiner—William A. Powell
Attorney, Agent, or Firm—Flehr, Hohbach, Test, Albritton & Herbert

[57] ABSTRACT

A two-step photoresist capping process for enhancing the etch resistance of photoresist during chlorinated plasma etching of silicon-containing materials comprises exposing the photoresist to a chlorinated plasma to form a silicon-chlorine containing material on the photoresist, and then exposing the resulting layer to an oxidizing plasma containing a chlorine etching species to selectivity oxidize the capping layer.

20 Claims, 5 Drawing Figures

IN-SITU PHOTORESIST CAPPING PROCESS FOR PLASMA ETCHING

BACKGROUND OF THE INVENTION

This invention relates in general to masking techniques, including photoresist masking techniques, for the etching of silicon.

In particular, the invention relates to a process for decreasing mask degradation, and for increasing the silicon:mask etch selectivity ratio in-situ during the silicon etch process and to the protective cap formed on the mask as the result.

As measured by the minimum feature size and device density, the scale of integration of semiconductor devices on integrated circuit chips (IC) has been improved greatly since the middle and late 1970's. In fact, over the past five years, the silicon IC technology has grown from large scale integration (LSI) to very large scale integration (VLSI), and is projected to grow to ultra-large scale integration (ULSI) by the end of the decade of the 1980's. This continued improvement in silicon integrated circuit integration has been made possible by advances in integrated circuit manufacturing equipment, as well as in the materials and methods used in processing semiconductor wafers into IC chips. Some of the most dramatic advances in manufacturing equipment have involved improved apparatus for lithography and etching. Generally, the density of integrated circuits and their speed of operation are dependent upon the accuracy and resolution of the lithography and etching apparatus which is used to form patterns of circuit elements in masking layers on the semiconductor wafer and then precisely replicate those patterns from the masking layers in the underlying semiconductor wafer layer(s).

FIG. 1 shows a widely used, low pressure ion-assisted plasma etching reactor system 10 which is available from Applied Materials, Inc. of Santa Clara, Calif. as the 8100 series etching system. The particular series is widely used within the industry for etching dielectrics such as oxides, nitrides and organic materials, for polysilicon and single crystal silicon etching, and for the etching of aluminum and aluminum alloys, all with a high degree of anisotropy.

The ion-assisted plasma etching reactor system 10 utilizes a process chamber having a metal wall 11 which serves as the anode in the RF system. Gas from a module 12 enters the chamber via gas inlet 13 and gas distribution ring or manifold 14 located at the top of the chamber. Spent etch products and gases are exhausted via ports 15 and 16. The exhaust port 15 is connected to a variable throttle valve 17 which, in response to the pressure sensing by a capacitive manometer 18, controls the chamber pressure by varying the pumping speed according to process requirements. The system exhaust port 15 is connected via the variable throttle valve 17 to a turbo molecular pump 19 which provides process pressures of about 3 to 300 millitorr and to a mechanical roughing pump 20. A nitrogen purge line is also provided for backfilling the process chamber with nitrogen to atmospheric pressure at the end of the etching process cycle. Exhaust port 16 is connected to a high speed cryo pump 22. The cryo pump 22 is used to provide very rapid pump-down of the process chamber to a low base pressure in addition to removal of water vapor from the chamber and residual water vapor absorbed in photoresist. The wafers 23 are vertically mounted on trays which are mounted on a rotatable hexagonal electrode or hexode 24 within the 24-inch diameter bell jar process chamber. The system is asymmetrical in the sense that the area of the cathode or hexode 23 is small in relation to the area of the bell jar wall or anode 11. This feature, in combination with low pressure operation, provides controlled bombardment to achieve the desired anisotropic etch reactions. RF power is supplied via a 13.56 MHz generator 25 which is coupled by a RF matching network 26 to the process chamber electrodes.

The ion-assisted plasma etch reactor system 10 shown in FIG. 1 has become a workhorse in the semiconductor industry since its introduction only a few years ago. In this system, the asymmetrical electrode arrangement and low pressure operation provide a controlled anisotropic etch reaction, characterized by excellent line width and etch rate uniformities for within-a-wafer, wafer-to-wafer and run-to-run measurements. The low pressure and controlled gas chemistry and process chamber temperatures provide clean etching surfaces and a clean system. In addition, the combination of low pressure operation at low power density levels provides excellent high selectivity to base layers. The system also is capable of sequential etching of different layers.

Despite the above-mentioned improvements made in the lithography and etching technologies over the last several years and despite the existence of excellent reactors, such as the system 10, FIG. 1, which are capable of reproducible, anisotropic etch performance, the current and future advanced bipolar, NMOS and CMOS technologies increasingly strain the capabilities of the existing mask technologies. In order to provide the very small minimum feature size IC chips used in these advanced technologies, it is necessary to prevent degradation or etching of the mask during the etch process and to very precisely maintain both the thickness and the lateral dimensions of the mask, both to provide exact replication of the mask in the etched layer such as polysilicon and to prevent phenomena such as punch-through in reduced thickness mask regions over stepped IC topographies. The result is the requirement of a very high layer-to-mask etch selectivity. Unfortunately, the resist masks which are used to pattern silicon provide silicon:mask etch selectivities of only about (1–2):1 using standard RIE (reactive ion etching) techniques. Higher selectivities are possible, for example, by incorporating appropriate species in the plasma etching gas to form an etch-protective polymer on the sidewalls of the silicon, but this is done at the expense of a relatively dirty process and of removing the polymer.

Accordingly, it is a principal object of the present invention to provide a process which forms a protective etch-resistant cap over the etch mask in-situ, as part of a standard plasma etch sequence.

It is another object of the present invention to provide an in-situ pre-etching procedure for forming a protective cap on an etch mask, which provides very high layer:mask etch selectivity.

It is also an object of the present invention to provide an in-situ pre-etching procedure for forming a protective etch-impervious cap on resist masks which provides very high silicon:mask etch selectivity and is readily removed when the mask is removed.

In one aspect, the present invention relates to a process for forming an etch-impervious layer on a mask over a layer in-situ preparatory to the etching of the layer, by exposing the mask to a plasma etching gas to form an oxidizable coating on the mask, and exposing the coating to an oxidizing gas plasma containing an etching species to oxidize the coating without substantial oxidation of the layer which is to be etched.

In another aspect, the present invention relates to a process for preparing an etch-impervious layer on a mask over a silicon-containing layer in-situ preparatory to etching the silicon-containing layer, by exposing the mask to a chlorine-containing etching gas plasma to form an oxidizable silicon-chlorine containing coating on the mask, and exposing the mask to an oxidizing plasma-containing oxygen or an oxygen-containing species and a chlorine-containing silicon etching species to oxidize the coating without oxidizing the silicon-containing layer.

The resulting cap is essentially impervious to etchant species such as chlorine so that, after the cap formation, the resist is protected from attack by the plasma etch process used to pattern the underlying layer.

As a consequence, after the cap is formed, the layer:-mask etch selectivity is very high and is essentially independent of the length of the etch process and accompanying overetch, even for long etch and overetch times. In addition, the cap is easily removed as part of the standard mask removal process.

In another aspect, the cap could be formed on a non-silicon-containing layer by applying a silicon-containing gas such as carbon tetrachloride to the process gas flow which is used to form the cap coating.

These and other aspects of the invention are described in conjunction with the drawings, wherein:

FIG. 1 schematically illustrates a commercially available etch reactor; and

FIGS. 2–5 illustrate the process sequence for forming the capping layer of, and according to the method of, the present invention (FIGS. 2 and 3), and the application of the capping layer during silicon etching and overetching steps (FIGS. 4 and 5).

DETAILED DESCRIPTION OF THE INVENTION

Figure 1:
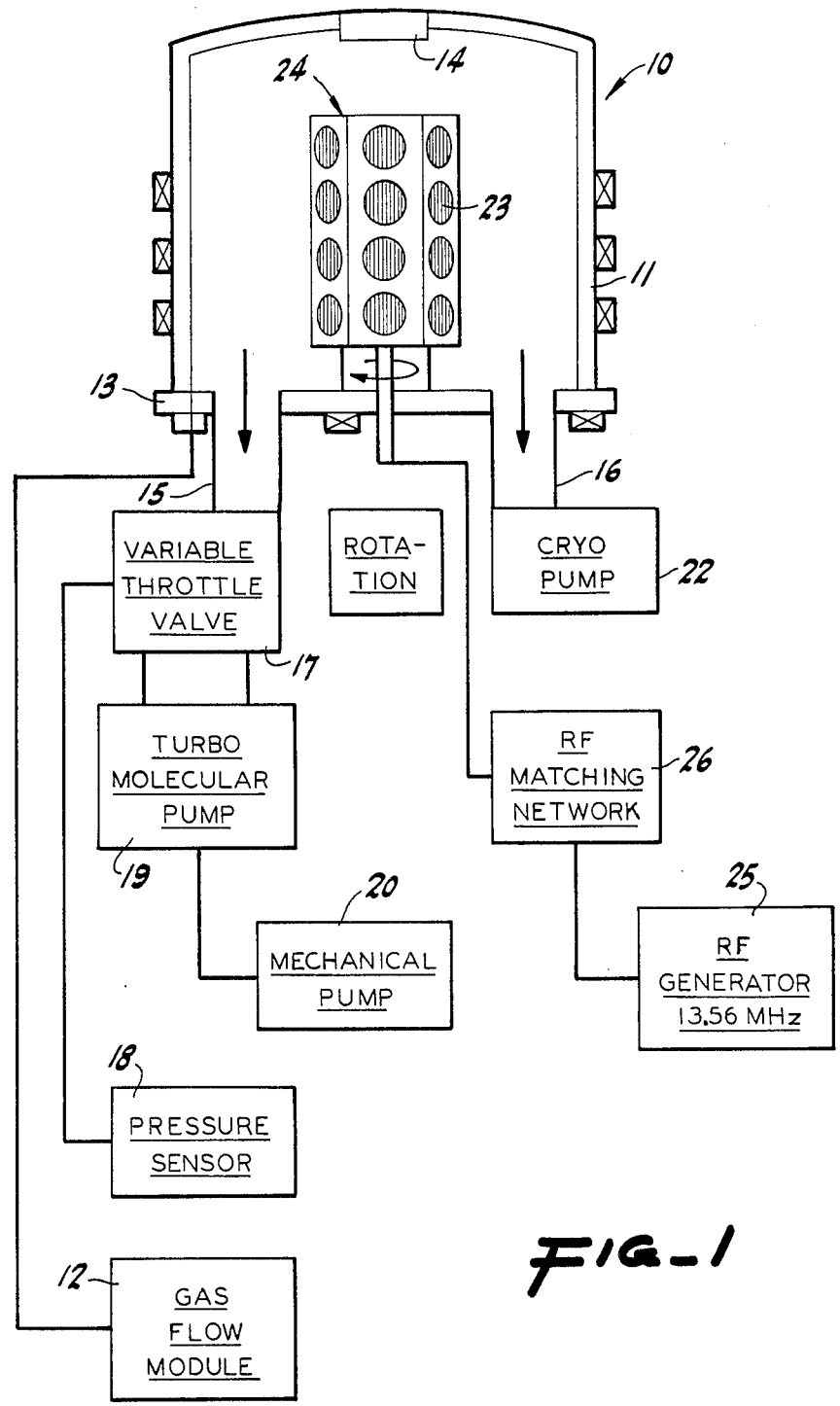

The present invention involves the discovery that a thin protective inorganic capping layer can be formed on a resist mask disposed on a silicon-containing material, in-situ during an etch procedure in a plasma etching reactor such as the reactor 10, FIG. 1. The process involves first, forming an inorganic layer or coating on the resist, then oxidizing that coating to form a conformal capping layer which is chemically inert to etching gases, such as the chlorinated etching gases which are used for plasma etching. As a consequence, the capping layer provides a very high etch selectivity to the resist.

The cap deposition or growth step involves applying one or a combination of chlorinated etching gases, such as $BCl_3$ and/or HCl at a reactor system pressure which is relatively high compared to the usual system polysilicon etching pressure and at a DC bias voltage level which is relatively low compared to the usual system bias voltage level used for polysilicon etching. The chlorine-containing gas generates chlorine-containing silicon etch products from the etched layer which evolve to the resist and, thus, condense there as a conformal coating or layer of the unoxidized capping material. Based upon the use of a chlorine-containing etchant and the silicon-containing layer, the usual silicon- and chlorine-containing etch products and the fact that the coating exhibits silicon-like oxidation, it is believed this complex is a silicon-chlorine containing material, quite likely of the form $SiCl_x$. It is believed the relatively high pressure "conditions" the resist surface by forming a sponge-like surface which is receptive to the formation of the capping material, and also facilitates formation of the silicon-chlorine containing material on the resist. The relatively low bias voltage is believed to be necessary to avoid damage to the growing complex.

In forming this silicon-chlorine containing capping material, other chlorine-containing gases such as $Cl_2$ itself may be used. The process is applicable to silicon layers, including polycrystalline silicon and monocrystalline silicon, and to silicon-containing compounds and materials such as the silicides. Also, a capping material may be formed when the mask is disposed on non-silicon-containing materials, by the simple expedient of incorporating an external source of silicon into the capping complex-forming step. For example, silicon-containing gases such as $SiCl_4$ could be incorporated into the process gas flow.

In short, the process is adaptable to substantially any fabrication process in which a material is etched using a resist material for pattern transfer.

The second, oxidation step involves the application of an oxidizing atmosphere containing $O_2$ or an oxygen-containing species such as $CO_2$, CO, or $N_2O$, along with an etching species such as HCl. This step typically used relatively normal system pressure of about 10–45 millitorr and a relatively normal system DC bias voltage level of about 200–350 volts to oxidize the capping layer and thereby complete the formation of the inert, etch-impervious impervious capping layer. Experimental evidence has shown that the oxidizing step requires this combination of an oxidizing atmosphere and an etching species. In fact, the step will not proceed without a small amount of etching species in the gas flow. The oxidation may require the generation of a silicon-chlorine compound to react with the existing capping material. Also, simultaneous etching prevents oxidation of the silicon or silicon-containing underlayer which would form a silicon oxide etch mask thereon.

Figure 2:
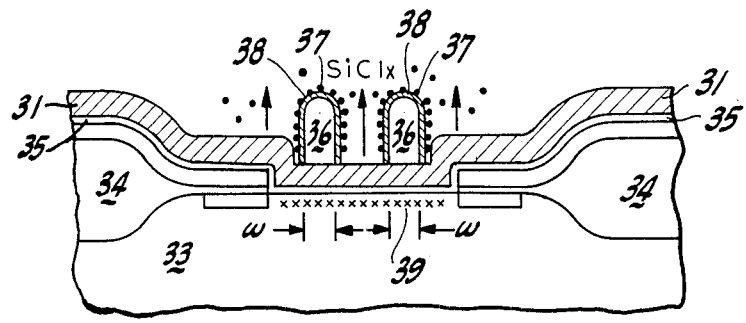

An example of the formation and use of the capping layer is shown in FIGS. 2 through 5. There, polysilicon layer 31 is to be patterned into a pair of lines or other members 32—32, FIG. 5. The exemplary MOS integrated circuit comprises a substrate 33 having a locos isolation oxide 34 formed therein and an oxide layer 35 underlying the polysilicon layer 31. Etch masks 36—36 are defined over the polysilicon in the active device region for the purpose of forming the lines or structures 32—32. As mentioned previously, replicating the resist mask 36 in the polysilicon layer 31 at very small line widths, w, requires a very high silicon:resist etch selectivity, $S_{pr}$, which is not inherent to the resist. In accordance with the present invention, however, a capping complex 37 is formed over the individual resist etch masks 36, as shown in FIG. 2, in-situ in the same reactor 10 which is used to etch the polysilicon layer 31. Specifically, and, typically, after applying a plasma etching step to remove the native oxide (not shown) over the polysilicon layer 31, a chlorinated etching gas is applied as described above to react with the etchant gas with the polysilicon layer to evolve the silicon-chlorine containing by-products from the silicon and condense the by-products onto the mask as the conformal coating layer 37. As mentioned, it is believed that the resist surface and the growing layer 37 are made sponge-like by this process and that this characteristic is necessary for completing a strong etch-resistant capping layer 38, FIG. 3. Also, this sponge-like characteristic is enhanced by the use of a relatively high system pressure.

Figure 3:
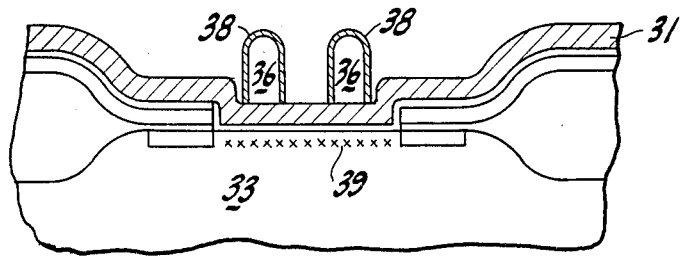

Referring further to FIG. 3, the second, oxidation step is next applied to complete the thin, conformal inert capping layer 38 from the coating 37. The oxidation step requires subjecting the complex 37 to an oxidizing atmosphere containing a silicon-etching species. Experience suggests the silicon-etching species is required for several reasons. First, it is necessary to etch the surrounding silicon to maintain it free from oxide growth. Such an oxide could form an unwanted mask over the silicon, thereby preventing etching of the polysilicon layer and, perhaps, preventing the formation of a strong, oxidized capping layer 38. Secondly, the oxide could form locally over random silicon locations, thereby forming micromasks which would prevent polysilicon etching during the subsequent polysilicon etch step. Third, the etching species is believed necessary to continue the formation of the silicon-chlorine containing complex during oxidation.

The second, oxidizing and etching step completes the formation of the protective capping layer 38. This layer is inert to etching and therefore substantially greatly enhances the resistance of the resist to etching, that is, increases $S_{pr}$. In fact, after formation of the capping layer, the resist is immune to attack by the etchant for even very long etch and overetch times.

As is evident from FIG. 3, the capping layer 38 is conformal to the resist (as well as being selectively formed on the resist). As a consequence, the capping layer protects both the top and sides of the resist from all aspects or components of the etching gas, including ion bombardment-type vertical components and chemically-dominated lateral components. The resulting benefits include preservation of the lateral dimensions and line width of the resist and, as a result, enhancement of the ability to precisely replicate the photoresist pattern in the underlying etched layer(s). Also, the resist preservation eliminates or very substantially decreases the tendency to punch-through relatively thin photoresist regions, such as those formed over stepped topographical features.

Figure 4:
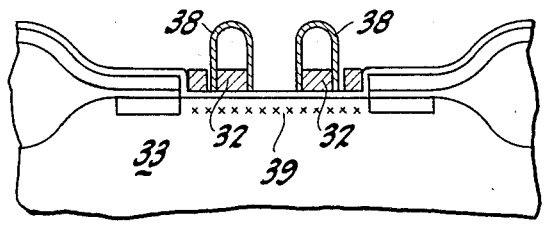
Figure 5:
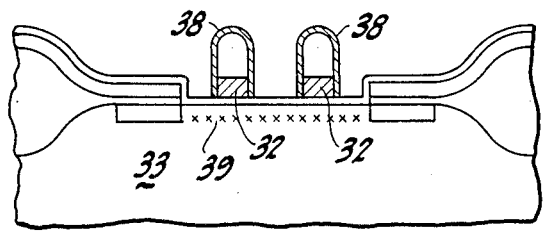

The beneficial characteristics of the capping layer 38 are illustrated schematically in FIG. 4, wherein a chlorinated etching gas such as HCl is applied during the main, polysilicon etch step, as well as in the overetch step illustrated in FIG. 5, wherein the etching is continued to completely remove the polysilicon from the steps, and scavenge the silicon-chlorine by-products.

Table 1 shows an operative set of process gases and parameters for the complex-forming step, FIG. 2, and the complex oxidation step, FIG. 3, using the reactor 10, FIG. 1. Here, HCl and/or BCl₃ provide the chlorine etch species during the complex-forming step (FIG. 2). During the oxidizing step (FIG. 3), the oxygen and HCl provide the required, combined oxidizing and etching ambient. In both steps, a carrier gas of He or Ar was used, but any standard carrier gas can be used. In the oxidation step, FIG. 3, increasing the oxygen flow within the range 2–20 sccm enhances the cap oxidation, whereas increasing the HCl within the stated range 10–75 sccm slows the cap oxidation. The cap formation and oxidation steps are somewhat temperature sensitive in that the normal system etch temperature is about 45° C. (measured at the pedestal) and a good cap formation presently requires a minimum temperature of about 50° C.

TABLE 1

| | (Useful) | |
| --- | --- | --- |
| | RANGE | |
| PARAMETER | Cap Formation | Oxidation |
| Total Flow Rate (SCCM) | 50–175 | 50–100 |
| Chamber Pressure (mT) | 50–100 | 10–45 |
| DC Bias (volts) | 100–200 | 200–350 |
| RF Power Setting (watts) | 200–1000 | 250–500 |
| Hexode Temperature (°C.) | 50–70 | 50–70 |
| GAS FLOW RATES | | |
| O₂ | 0 | 2–20 |
| HCl | ≦50 | 10–75 |
| BCl₃ | ≦100 | 0 |
| Carrier | ≦100 | ≦50 |

Experience indicates that good cap formation is obtained up to at least the system maximum temperature of 70°–75° C. Furthermore, as mentioned previously during the complex-forming step, FIG. 2, the chamber pressure range of 50–100 millitorr is high relative to the usual system chamber pressure for the purpose of conditioning the resist to accept the complex, whereas the DC bias voltage range of 100–200 volts is relatively lower than the usual etching range of 200–350 volts, to preserve the integrity of the capping layer 37 as it is being formed. Present experience is that the capping layer is readily formed on any resist. To date, it has been formed on IBM proprietary resist, on positive AZ1470, positive Kodak 809 and PMMA (polymethylmathacrylate) electron beam resist.

Table 2 illustrates a presently preferred range of parameters and gas flow rates. The effect of varying parameters and flow rates is precisely as described previously, for example, with regard to Table 1 above. The presently preferred ranges routinely provide a silicon:-photoresist etch selectivity, $S_{pr} \approx \geq 7:1$, using standard positive organic photoresist over polycrystalline silicon layers. It should be emphasized that this etch selectivity ratio, high though it may be, is not indicative of the true value of the capping layer 38. This etch selectivity ratio represents the selectivity at the time layer 38 is formed. After formation of the cap 38, the resist is impervious to the etchant, as mentioned, for even very long etch and overetch sequences.

TABLE 2

| | (Preferred) | |
| --- | --- | --- |
| | RANGE | |
| PARAMETER | Cap Formation | Oxidation |
| Total Flow Rate (SCCM) | 50–175 | 50–100 |
| Chamber Pressure (mT) | 60–80 | 10–20 |
| D.C. Bias (volts) | 140–180 | 200–300 |
| RF Power Setting (watts) | 300–800 | 250–350 |
| Hexode Temperature (°C.) | 55 | 55 |
| GAS FLOW RATES | | |
| O₂ | 0 | 4–10 |
| HCl | 10–20 | 25–50 |
| BCl₃ | ≦100 | 0 |
| Carrier | 40–70 | ≦50 |

Table 3 lists the parameters and gas flow rates for a specific, cap formation and polysilicon etching process using the present invention and reactor 10, FIG. 1. Here, the resist 36 was PMMA approximately 13,000 Angstroms thick, the polysilicon layer 31 was undoped, about 2200 Angstroms thick, and the silicon dioxide layer 35 was about 950 Angstroms thick. The five-step sequence described in Table 3 corresponds to FIGS. 2 through 5 as follows: clean (not shown); cap formation (FIG. 2); oxidation (FIG. 3); main poly etch (FIG. 4); and overetch (FIG. 5). The Table 3 sequence was employed to completely remove the exemplary 2200 Angstrom thick undoped poly layer 31 at an etch rate of about 525 Angstroms per minute. After the poly etch and overetch, the original 13,000 Angstrom PMMA mask thickness was reduced only approximately 400 Angstroms, at an average etch rate of 70 Angstroms per minute and giving a selectivity $S_{pr} \approx 7.5$. The original 950 Angstroms thickness of the oxide base layer was reduced approximately 30 Angstroms, for an average etch rate of approximately 20 Angstroms per minute, and a selectivity of $S_{ox} \approx 26$.

TABLE 3

| | RANGE | | | | |
|---|---|---|---|---|---|
| | Clean | Cap Formation (FIG. 2) | Oxidation (FIG. 3) | Poly Etch (FIG. 4) | Overetch (FIG. 5) |
| PARAMETER | | | | | |
| Chamber Presser (mTorr) | 20 | 85 | 10 | 10 | 15 |
| D.C. Bias (volts) | −200 | −150 | −275 | −300 | −250 |
| RF Power Setting (watts) | 425 | 810 | 265−285 | 330 | 240 |
| Hexode Temperature (°C.) | 55 | 55 | 55 | 55 | 55 |
| Time (min.) | 2.0 | 1.5 | 1.5 | 3.5 | 0.7 |
| GAS FLOW RATES | | | | | |
| He | 0 | 60 | 0 | 0 | 0 |
| HCl | 0 | 15 | 30 | 100 | 30 |
| BCl$_3$ | 50 | 100 | 0 | 0 | 13 |
| Ar/O$_2$ | 0 | 0 | 50 | 15 | 15 |

Table 3 is self-explanatory. Thus, the individual steps will be described here by way of a summary and expansion of the various features of the inventive process and the application of that process.

The cleaning step is a conventional step used in the reactor 10 for the removal of chamber moisture and the native oxide on the polysilicon surface prior to cap formation and polyetch. The primary purpose of the step is process reproducibility. It is entirely conceivable that the cap formation step may be used to accomplish the same purpose, thus obviating the need for a separate cleaning step.

The parameters and gas flow rates for the cap formation step are very well established for the particular process and provide excellent reproducible formation of the chemical complex 37, FIG. 2, without variation. The particular parametric values, of course, reflect the considerations described previously.

The critical cap oxidation step, FIG. 3, involves several parameters which highly influence the cap formation. The Ar/O$_2$ gas mixture was a mixture of 20 percent oxygen in argon. The cap formation and cap strength are directly proportional to the amount of the oxygen. In contrast, the cap formation and strength are inversely proportional to the HCl flow. Of course, HCl flow is needed to keep the polysilicon etching during the cap formation and to avoid surface oxidation. Finally, increasing the pressure strengthens the cap, but at some high level of pressure, the process may be subject to residue formation and non-uniformity.

In the main polysilicon etch step, FIG. 4, an Ar/O$_2$ flow rate of about 15 sccm is used to etch the polysilicon without damaging the photoresist cap 38 (the oxygen protects the cap). Increasing the Ar/O$_2$ rate will also increase the polysilicon etch rate, but too high a flow rate can cause residue formation. Again, as mentioned previously, the low pressure used prevents residue formation. Also, the relatively high bias level provides an anisotropy and eliminates residue, but too high a bias can damage or break the cap 38.

The overetch step, of course, requires high oxide selectivity as well as high polysilicon selectivity. In this step, the Ar/O$_2$ flow is directly proportional to the oxide selectivity.

The hexode temperature of about 55° C. not only permits effective formation of the capping complex 37, but also aids in maintaining a clean reactor chamber. Low HCl flow rates reduce end point loading effects while still maintaining significant etch rates. The He acts as a carrier gas at low etch gas flow rates, and also helps improve oxide selectivity and uniformity. The low bias protects the oxide 35 and the cap 38. Finally, the low pressure enhances oxide selectivity and uniformity, although too low a pressure (about 15 millitorr) may result in the power being too low.

Removal of the capping layer 38 requires an oxide-removing component in the strip. This can be done, for example, using a barrel ash containing 20 percent CF$_4$ in O$_2$ followed by a standard barrel ash using O$_2$ alone. Also, a wet chemical etch dip could be used in combination with the standard oxygen ash treatment.

In the above description, it should be apparent that the cap formation method of the present invention provides a number of advantages over prior art resist-only masks and prior art mask enhancement techniques. As mentioned, the resist cap makes the resist impervious to the etch process. In addition, the use of oxygen, e.g., in the overetch step or in a combined main etch-overetch increases the polysilicon to oxide selectivity. These results are achieved along with excellent resulting replication of the protected mask in underlying layer(s) by the selection of conventionally available process gases and reactor operating parameters using commercially available reactors such as reactor 10, FIG. 1.

While this invention has been described above in connection with various preferred and alternative embodiments of the cap formation method, it should be understood that persons of skill in the art can make numerous modifications without departing from the scope of the invention as claimed in the following claims.

What is claimed is:

1. A method for conditioning an organic mask layer to increase the resistance of the mask to the etching of an underlying layer, comprising: exposing the mask to a plasma formed from a silicon-containing gas for forming a protective silicon-containing coating on the mask; and exposing the coating to a plasma containing an oxidizing species for selectively oxidizing the coating.

2. A method for conditioning an organic mask to increase the resistance of the mask to the etching of an underlying silicon-containing layer, comprising: exposing the mask to a plasma containing a silicon-etching species for forming a silicon-containing coating on the mask; and exposing the coating to an oxidizing plasma containing a silicon-etching species for selectively oxidizing the coating.

3. The process of claim 2, wherein the silicon-etching species is selected from at least one of HCl and BCl$_3$.

4. The process of claim 2, wherein the silicon-etching species is provided by a mixture of HCl and BCl$_3$.

5. The process of claim 3, wherein the dominant etching component of the oxidizing plasma is provided by HCl.

6. A method of conditioning a resist etch mask layer to increase the etch resistance thereof, comprising disposing the mask on a silicon layer; exposing the resist etch mask layer to a chlorine-containing gas to form a layer containing a silicon-chlorine complex on the mask; and exposing the resulting composite to an oxidizing gas mixture containing a silicon etching species for oxidizing the silicon containing layer to thereby form a conformal, etch resistant capping layer over the resist layer.

7. The process of claim 6, wherein the chlorine-containing gas is selected from at least one of HCl and BCl$_3$.

8. The process of claim 6, wherein the chlorine-containing gas comprises a mixture of HCl and BCl$_3$.

9. The process of claim 6, wherein oxygen is the dominant oxidizing component of the oxidizing gas mixture.

10. The process of claim 7, wherein the dominant etching component of the oxidizing gas mixture is HCl.

11. In a method for etching a silicon-containing layer in a closed plasma etching chamber using a resist mask and a chlorinated etching gas, the steps of preparing the resist mask for etching, comprising:

disposing the resist mask on the silicon-containing layer, which is disposed on one of a pair of electrode structures in the chamber;

as a first conditioning step, communicating into said chamber a reactive gas mixture comprising a chlorinated gas selected from at least one of BCl$_3$ and HCl;

supplying RF electrical energy to one of said electrodes to create a plasma of said reactive gas mixture for etching the silicon-containing layer and forming a silicon- and chlorine-containing layer on the resist; and as a second conditioning step, communicating into said chamber a reactive gas mixture comprising an oxygen-containing species for oxidizing the silicon-containing layer and an etching species for etching the silicon-containing layer.

12. The process of claim 6, wherein the oxygen-containing species is oxygen and the etching species is HCl.

13. The process of claim 11, wherein, during the first conditioning step, the RF power setting is 200–1,000 watts, the chamber pressure is 50–100 millitorr, the total gas flow rate is 50–175 sccm and the hexode temperature is 50°–70° C.

14. The process of claim 13, wherein the HCl and BCl$_3$ flow rates are, respectively, ≦50 sccm and ≦100 sccm.

15. The process of claim 11, wherein, during the second conditioning step, the oxygen-containing species is oxygen at a flow rate of 2–20 sccm and the etching species is HCl at a flow rate of 10–75 sccm.

16. The process of claim 15, wherein, during the second conditioning step, the RF power is 250–500 watts, the chamber pressure is 10–45 millitorr, the total gas flow rate is 50–100 sccm and the hexode temperature is 50°–70° C.

17. The process of claim 11, wherein, during the first conditioning step, the RF power is 300–800 watts, the chamber pressure is 60–80 millitorr, the total flow rate is 50–175 sccm and the hexode temperature is about 55° C.

18. The process of claim 17, wherein, during the first conditioning step, the HCl and BCl$_3$ flow rates are, respectively, 10–20 sccm and ≦100 sccm.

19. The process of claim 7, wherein, during the second conditioning step, the oxygen-containing species is oxygen at a flow rate of 4–10 sccm and the etching species is HCl at a flow rate of 25–50 sccm.

20. The process of claim 19, wherein, during the second conditioning step, the RF power is 250–350 watts, the chamber pressure is 10–20 millitorr, the total flow rate is 50–100 sccm and the hexode temperature is about 55° C.

* * * * *

UNITED STATES PATENT AND TRADEMARK OFFICE
CERTIFICATE OF CORRECTION

PATENT NO. : 4,613,400
DATED : September 23, 1986
INVENTOR(S) : SIMON W. TAM ET AL It is certified that error appears in the above-identified patent and that said Letters Patent are hereby corrected as shown below:

IN THE CLAIMS

In Claim 1, Col. 8, line 62, change "method" to --process--.

In Claim 2, Col. 9, line 1, change "method" to --process-.

In Claim 6, Col. 9, line 16, change "method of" to --process for--.

In Claim 11, Col. 9, line 36, change "method" to --process--.

In Claim 12, Col. 10, line 11, change "claim 6" to --claim 11--.

Signed and Sealed this

Sixteenth Day of December, 1986

Attest:

DONALD J. QUIGG

*Attesting Officer*     *Commissioner of Patents and Trademarks*